US012613299B2

(12) United States Patent
Liu et al.

(10) Patent No.: US 12,613,299 B2
(45) Date of Patent: Apr. 28, 2026

(54) CALIBRATION METHOD OF MAGNETIC FIELD MODEL AND CONTROLLER FOR ELECTROMAGNETIC POSITIONING

(71) Applicant: Metal Industries Research & Development Centre, Kaohsiung (TW)

(72) Inventors: Zong-Hsin Liu, Kaohsiung City (TW); Po-Chi Hu, Kaohsiung City (TW); I-Chiao Tsai, Kaohsiung City (TW); Hsiang-An Chuang, Tainan City (TW); Chih-Chung Lin, Kaohsiung City (TW); Chih-Hsuan Huang, Kaohsiung City (TW); Chieh Hua Chen, Kaohsiung City (TW)

(73) Assignee: Metal Industries Research & Development Centre, Kaohsiung (TW)

( * ) Notice: Subject to any disclaimer, the term of this patent is extended or adjusted under 35 U.S.C. 154(b) by 272 days.

(21) Appl. No.: 18/518,590

(22) Filed: Nov. 23, 2023

(65) Prior Publication Data

US 2025/0172648 A1 May 29, 2025

(51) Int. Cl.
*G01R 35/00* (2006.01)
*G01R 33/00* (2006.01)
*G01R 33/02* (2006.01)

(52) U.S. Cl.
CPC ....... *G01R 35/005* (2013.01); *G01R 33/0017* (2013.01); *G01R 33/0035* (2013.01); *G01R 33/0206* (2013.01)

(58) Field of Classification Search
CPC .............. G01R 35/005; G01R 33/0017; G01R 33/0035; G01R 33/0206; G06F 17/16;
(Continued)

(56) References Cited

U.S. PATENT DOCUMENTS 9,364,293 B2 6/2016 Shalgi et al.
2008/0082269 A1* 4/2008 Stoyer ..................... G01V 3/12
702/6
(Continued)

FOREIGN PATENT DOCUMENTS

CN 101073497 11/2012
CN 108227037 6/2018
(Continued)

OTHER PUBLICATIONS

"Office Action of Taiwan Counterpart Application", issued on Nov. 5, 2024, p. 1-p. 7.

*Primary Examiner* — Alvaro E Fortich
(74) *Attorney, Agent, or Firm* — JCIPRNET

(57) ABSTRACT

A calibration method of the magnetic field model and a controller for electromagnetic positioning are provided. In the method, a magnetic field is established through a magnetic field transmitter; measurement data is obtained through a magnetic field sensor, where the measurement data includes the amplitude of induced voltage at multiple measurement positions in the magnetic field; and the magnetic field model is corrected according to the error between the measurement data and simulated data correction, where the magnetic field model is used to generate simulation data corresponding to multiple measurement locations. The steps of modifying the magnetic field model include: establishing one or more objective functions through the nonlinear least squares method based on the error between the measured data and the simulated data; and determining the modified magnetic field model based on one or more solutions of the objective function. Therefore, positioning accuracy can be improved.

10 Claims, 6 Drawing Sheets

(58) Field of Classification Search
CPC .......... G06F 30/27; G06F 30/20; G06F 17/17;
G06F 17/18; G06F 17/175; G06F 17/13;
G06F 17/142; G06F 2119/10; G06F
11/3447; G06F 17/11; G06F 17/12; G06F
18/27; G06F 2111/10; G06F 30/23; G06N
7/08; G06N 3/08
See application file for complete search history.

(56)                         References Cited

U.S. PATENT DOCUMENTS

| | | | |
|---|---|---|---|
| 2009/0006053 A1* | 1/2009 | Carazzone | ............. G01V 3/083 703/5 |
| 2019/0056242 A1 | 2/2019 | Foster et al. | |

FOREIGN PATENT DOCUMENTS

| | | |
|---|---|---|
| CN | 110932416 | 3/2020 |
| CN | 112002532 | 11/2020 |
| TW | I449303 | 8/2014 |
| TW | 202321726 | 6/2023 |

* cited by examiner

70

S810 — Generating a transmit signal

S820 — Transmitting the transmit signal

S830 — Measuring magnetic flux

S840 — Spatial positioning

S850 — Continued positioning

S870 — Adjusting sensing gain

S860 — Selecting a model that corresponds to the height

CALIBRATION METHOD OF MAGNETIC FIELD MODEL AND CONTROLLER FOR ELECTROMAGNETIC POSITIONING

BACKGROUND

Technical Field

The application relates to an electromagnetic field positioning technology, and in particular, to a calibration method of magnetic field model and a controller for electromagnetic positioning.

Description of Related Art

Electromagnetic Tracking (EMT) system in the body can establish a controllable magnetic field space through a field generator (FG) (for example, a transmitting coil) to determine the position and/or direction of the magnetic induction coil in the space. Therefore, the EMT is often used in medical, robotics, and virtual reality applications that require precision.

The sensing gain of the magnetic induction coil in general EMT systems cannot be adjusted, so the Signal to Noise Ratio (SNR) caused by being located at high altitudes cannot be immediately improved through the gain of the induction coil. In addition, it is also unable to respond to the rapid decrease in magnetic field strength of the electromagnetic field generator with distance, which causes the signal-to-noise ratio of the induction coil to decrease, thus affecting positioning accuracy and limiting the measurement distance.

SUMMARY

The present invention provides a calibration method of magnetic field model and a controller for electromagnetic positioning, which can establish a magnetic field model that is close to the actual situation, thereby improving positioning accuracy.

The calibration method of the magnetic field model for electromagnetic positioning of the embodiment of the present invention includes (but not limited to) the following steps: establishing a magnetic field through a magnetic field transmitter; obtaining measurement data through a magnetic field sensor, where the measurement data includes the amplitude of induced voltage at multiple measurement positions in the magnetic field; and the magnetic field model is corrected according to the error between the measurement data and the simulation data correction, where the magnetic field model is used to generate simulation data corresponding to multiple measurement locations. The steps of modifying the magnetic field model include: establishing one or more objective functions through the nonlinear least squares method based on the error between the measured data and the simulation data; and determining the modified magnetic field model based on one or more solutions of the objective function.

The controller of the embodiment of the present invention includes a memory and a processor. The memory is configured to store a program code. The processor is coupled to the memory. The processor loads the program code to execute: establishing a magnetic field through a magnetic field transmitter; obtaining measurement data through a magnetic field sensor, where the measurement data includes the amplitude of induced voltage at multiple measurement positions in the magnetic field; and correcting a magnetic field model according to an error between the measurement data and simulation data, where the magnetic field model is used to generate the simulation data corresponding to the measurement locations. The steps of modifying the magnetic field model include: establishing one or more objective functions through the nonlinear least squares method based on the error between the measured data and the simulation data; and determining the modified magnetic field model based on one or more solutions of the objective function.

Based on the above, the calibration method of magnetic field model and the controller for electromagnetic positioning of the embodiment of the present invention determine the error between the measurement data and the simulation data, and correct the magnetic field model accordingly. In this way, a reference model with high positioning accuracy can be provided.

In order to make the above-mentioned features and advantages of the present invention more obvious and easier to understand, embodiments are given below and described in detail with reference to the attached drawings.

DESCRIPTION OF THE EMBODIMENTS

Figures 1A, 1B:
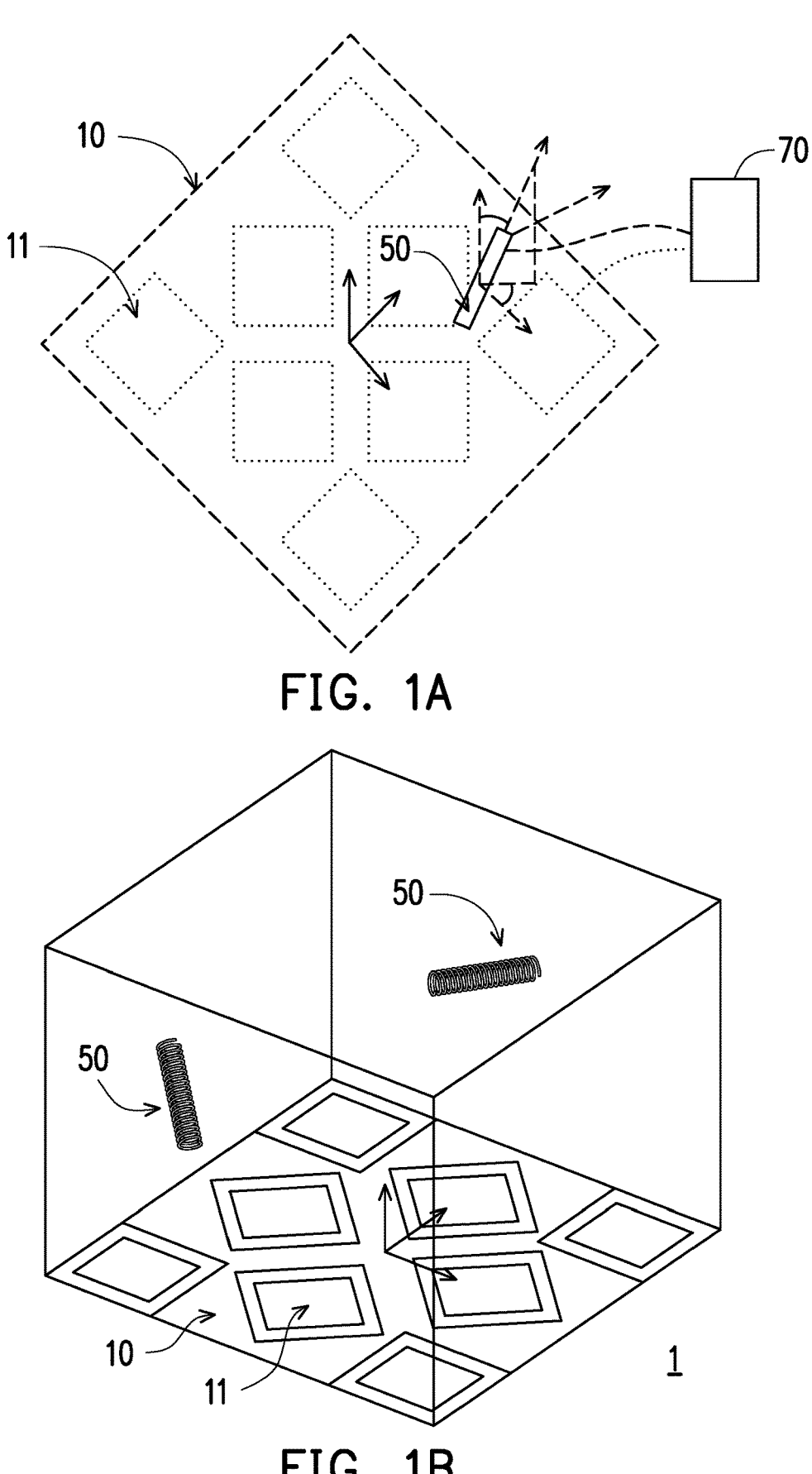
FIG. 1A to FIG. 1C are schematic diagrams of a system according to an embodiment of the present invention.
Figure 1C:
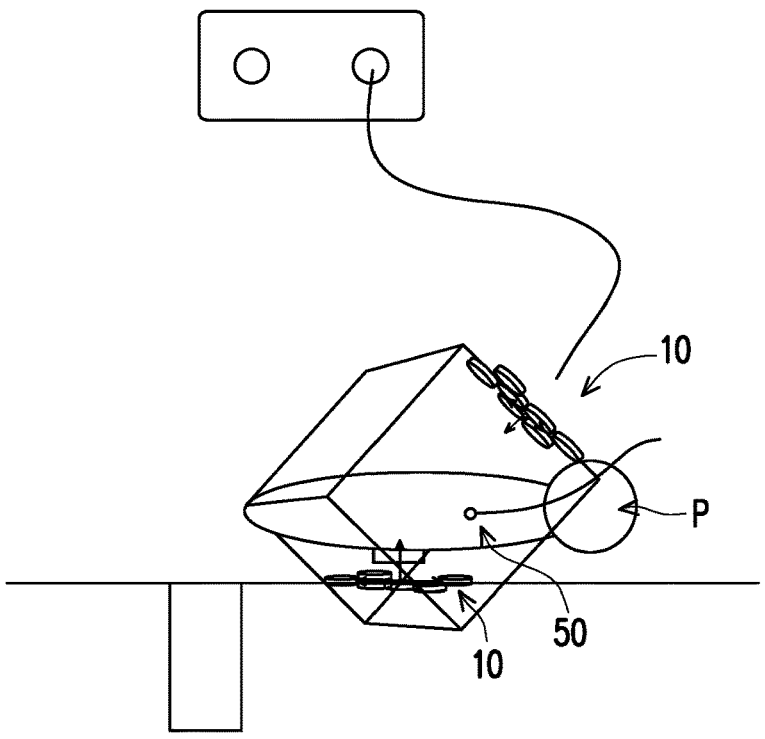

FIG. 1A to FIG. 1C are schematic diagrams of a system according to an embodiment of the present invention. Referring to FIG. 1A to FIG. 1C, the system 1 includes (but not limited to) a magnetic field transmitter 10, a magnetic field sensor 50 and a controller 70.

In an embodiment, the system 1 can be used for electromagnetic field positioning. For example, (S1) Establish a virtual space model of the magnetic field transmitter 10 based on the origin and the turning point of the line segment; (S2) Feed a current and measure a magnetic sensing intensity at any point in space to correlate the magnetic field intensity with the spatial position; (S3)) Introduce the magnetic field sensor 50 to establish a correlation between the magnetic field intensity and voltage (magnetic flux) changes; (S4) Optimize a magnetic field model of the transmitting coil of (S1) and (S2); (S5) Calculate a position and a direction of the magnetic field sensor 50 through the least square error of experimental and model magnetic flux (as shown in FIG. 1A); (S6) Create a visual three-dimensional environment based on the coordinate information.

Thereby, the position and attitude of the magnetic field sensor 50 can be estimated based on the magnetic flux measured by the magnetic field sensor 50 (as shown in FIG. 1B and FIG. 1C).

Taking FIG. 1C as an example, the magnetic field sensor 50 can be installed on the organ of the person P. And computers or other controllers can control the radiation of the magnetic field transmitter 10 and measure the magnetic flux through the magnetic field sensor 50, thereby obtaining the position and/or attitude of the organ.

It should be noted that, there are many ways to realize electromagnetic field positioning, and the embodiments of the present invention are not limited thereto. In addition, the system 1 may also have other application scenarios.

In an embodiment, the magnetic field transmitter 10 includes a plurality of transmitting units 11.

Figure 2:
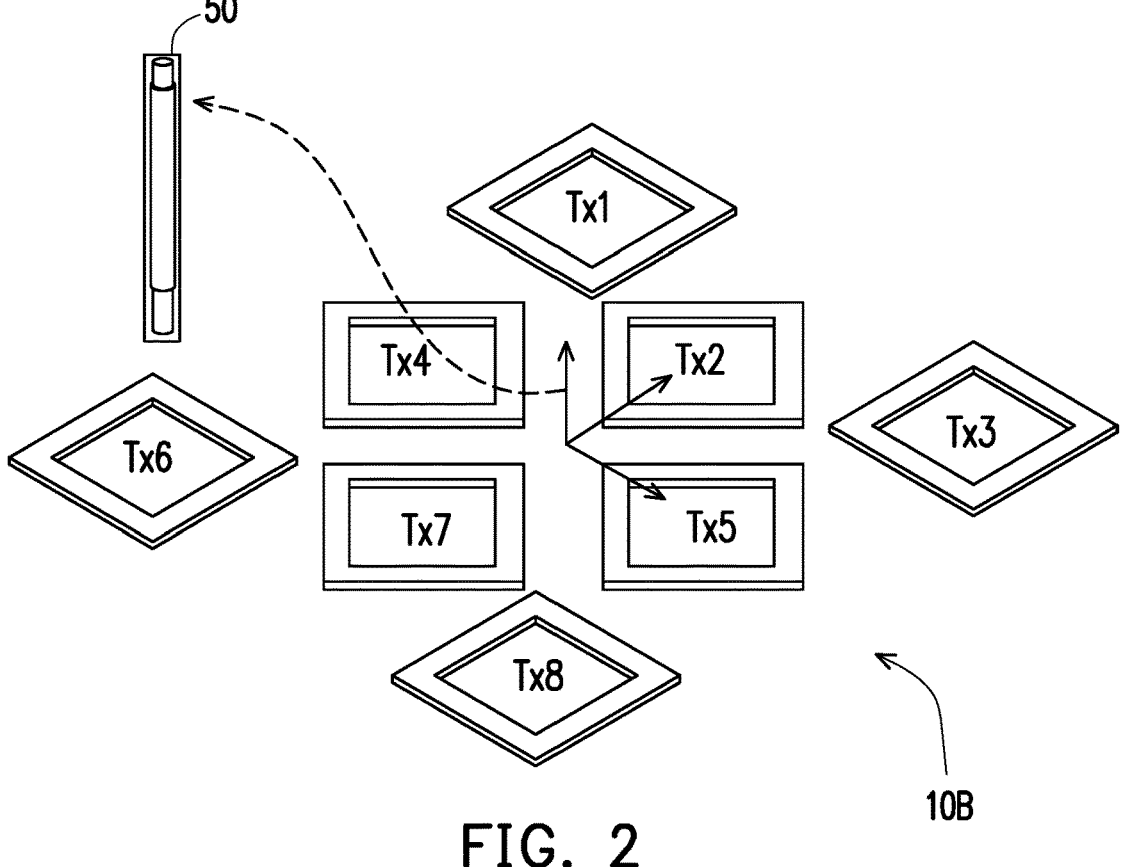
FIG. 2 is a schematic diagram of a magnetic field transmitter and a magnetic field sensor according to an embodiment of the present invention.

For example, FIG. 2 is a schematic diagram of a magnetic field transmitter 10B and the magnetic field sensor 50 according to an embodiment of the present invention. Referring to FIG. 2, the magnetic field transmitter 10B includes a plurality of transmitting units Tx1, Tx2, Tx3, Tx4, Tx5, Tx6, Tx7, and Tx8. Each transmitting unit Tx1~Tx8 includes one or more planar transmitting coils. The planar transmitting coil in each transmitting unit Tx1~Tx8 is a spiral coil formed by wires (such as, made of copper, aluminum or other conductive materials) wrapped in a quadrilateral (but it could also be a triangle, hexagon or other polygon) on a plane (such as, a horizontal plane, a vertical plane or any plane). These planar coils help achieve thinner and higher-density designs.

In an embodiment, each transmitting unit Tx1, Tx2, Tx3, Tx4, Tx5, Tx6, Tx7, and Tx8 is installed on a substrate through a layered process. For example, Printed Circuit Board (PCB), Flexible Printed Circuit (FPC), or Low-Temperature Co-fired Ceramic (LTCC) and other layered process technologies.

The transmitting units Tx1, Tx3, Tx6, and Tx8 surround the transmitting units Tx2, Tx4, Tx5, and Tx7. The distances from the transmitting units Tx1, Tx3, Tx6, and Tx8 to the center point of the magnetic field transmitter 10B are greater than the distances from the transmitting units Tx2, Tx4, Tx5, and Tx7 to the center point of the magnetic field transmitter 10B respectively. The transmitting units Tx1, Tx3, Tx6, and Tx8 are rotated 45 degrees compared to the transmitting units Tx2, Tx4, Tx5, and Tx7.

It should be noted that, the number and arrangement of the transmitting units may also have other changes, and the transmitting units are not limited to the planar transmitting coils.

In an embodiment, each transmitting unit Tx1~Tx8 independently inputs current (such as, AC current). These transmitting units Tx1~Tx8 have the same power characteristics. The power characteristic is the voltage gain of the magnetic field transmitter 10, 10B or the current gain of the magnetic field transmitter 10, 10B. For example, the voltage gain, current gain and/or current frequency of these transmitting units Tx1~Tx8 may be the same. The power characteristics of the transmitting units Tx1, Tx3, Tx6, and Tx8 may be one to two times the power characteristics of the transmitting units Tx2, Tx4, Tx5, and Tx7. For example, the voltage gain and/or current gain of the transmitting units Tx1, Tx3, Tx6, and Tx8 is one to two times the voltage gain and/or current gain of the transmitting units Tx2, Tx4, Tx5, and Tx7. For another example, the transmitting units Tx1~Tx8 have different current frequencies. The current frequency can range from 3 to 100 kilohertz (kHz).

For another example, the coil current intensity of the transmitting units Tx1~Tx8 can be set individually, and the current range is recommended to be 0.1 A (ampere)-5.5 A. The setting cane comply with the transmitter magnetic field strength specification of 3-100 khz 100 uTrms (80 A/m) specified by the International Commission on Non-Ionizing Radiation Protection (ICNIRP). The current intensity of the transmitting units Tx1~Tx8 can be set to 0.33 A, 0.28 A, 0.33 A, 0.28 A, 0.28 A, 0.33 A, 0.28 A, and 0.33 A in sequence. In this way, the strength and field shape of the plane magnetic field can be made more uniform through fine-tuning differences in different currents in the coil. In addition, the frequency setting of the transmitting units Tx1~Tx8 is related to the sensitivity performance of the magnetic field sensor 50 at any position in space. Averagely configure the frequency within the test range, no need to follow the order. For example: the transmitting unit Tx1 is 13.5 khz, the transmitting unit Tx2 is 13 khz, the transmitting unit Tx3 is 11.5 khz, the transmitting unit Tx4 is 12 khz, the transmitting unit Tx5 is 10.5 khz, the transmitting unit Tx6 is 11 khz, the transmitting unit Tx7 is 12.5 khz, the transmitting unit Tx8 is 14 khz. The setting enables the magnetic field sensor 50 to maximize the sensitivity of each measurement position within the measurement range without being greatly affected by frequency. In this way, a composite uniform magnetic field can be generated.

The magnetic field sensor 50 includes a sensing unit (such as, one or more planar or cylindrical sensing coils). Taking the planar sensing coil as an example, the planar sensing coil is a spiral coil formed by wires (such as, made of copper, aluminum or other conductive materials) wrapped in a geometric shape on a plane (such as, a horizontal plane, a vertical plane or any plane). In some embodiments, the geometric shape is a polygon (such as, quadrilateral, hexagon, or octagon) or a circle.

In an embodiment, the sensing units of the magnetic field sensor 50 is installed on a flexible substrate through the layered process. For example, PCB, FPC, LTCC and other layered process. The flexible substrate is, for example, a PI film or made of biocompatible polymer materials, suitable for adhering to the body surface or internal organs. In an embodiment, the wires are embedded with a ferrite core. The ferrite core has high magnetic permeability characteristics, which can optimize the sensing voltage output, thereby improving the system signal-to-noise ratio and reducing position and orientation errors.

It should be noted that, the sensing unit is not limited to planar or columnar sensing coils.

Figure 3:
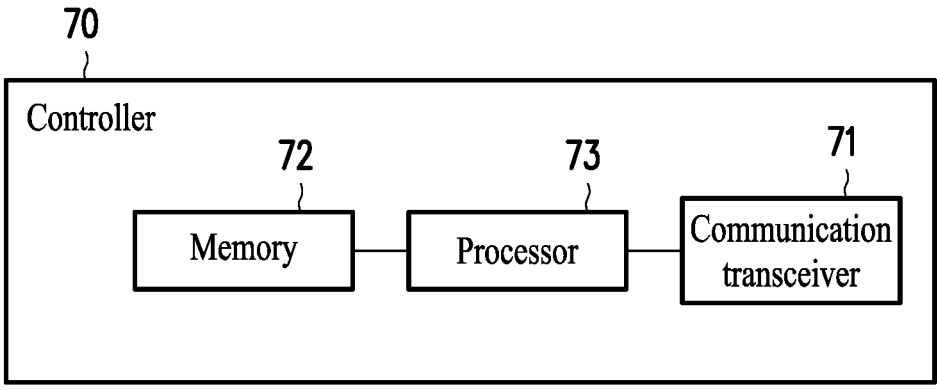
FIG. 3 is a block diagram of components of a controller according to an embodiment of the present invention.

FIG. 3 is a block diagram of components of the controller 70 according to an embodiment of the present invention. Referring to FIG. 3, the controller 70 includes (but not limited to) a communication transceiver 71, a memory 72 and a processor 73.

The communication transceiver 71 includes (but not limited to) an amplifier, an analog to digital converters, filter, an oscillator and/or a data acquisition interface card. In an embodiment, one or more communication transceivers 71 is connected to the magnetic field transmitter 10 and the magnetic field sensor 50. The communication transceiver 71 can receive sensing data (such as, magnetic flux, induced voltage amplitude) from the magnetic field sensor 50. In addition, the communication transceiver 71 can transmit control instructions to the magnetic field transmitter 10 and the magnetic field sensor 50. The control instruction is, for example, adjusting the power characteristics of the magnetic field transmitter 10 and the magnetic field sensor 50. The power characteristic is, for example, the voltage gain of the magnetic field transmitter 10, the current gain of the magnetic field transmitter 10 or the sensing gain of the magnetic field sensor 50.

The memory 72 can be any type of fixed or removable Radom Access Memory (RAM), Read Only Memory (ROM), flash memory, Hard Disk Drive (HDD), Solid-State Drive (SSD) or similar component. In an embodiment, the memory 72 is used to store program codes, software modules, configuration configurations, data or files (for example, magnetic field models, sensing data, or parameters), which will be described in detail in subsequent embodiments.

The processor 73 is coupled to the communication transceiver 71 and the memory 72. The processor 73 can be a Central Processing Unit (CPU), Graphic Processing unit (GPU), or other programmable general or special purpose microprocessor, Digital Signal Processor (DSP), programmable controller, Field Programmable Gate Array (FPGA), Application-Specific Integrated Circuit (ASIC), neural network accelerator or other similar components or a combination of the above components. In an embodiment, the processor 73 is used to execute all or part of the operations of the controller 70, and can load and execute various program codes, software modules, files and data stored in the memory 72. In some embodiments, part of the operations in the method of the embodiment of the present invention may be implemented by different or the same processor 73.

In the following, the method described in the embodiment of the present invention will be explained with various devices, components and modules in the system 1. Each process of the method can be adjusted according to the implementation situation, and is not limited thereto.

Figure 4:
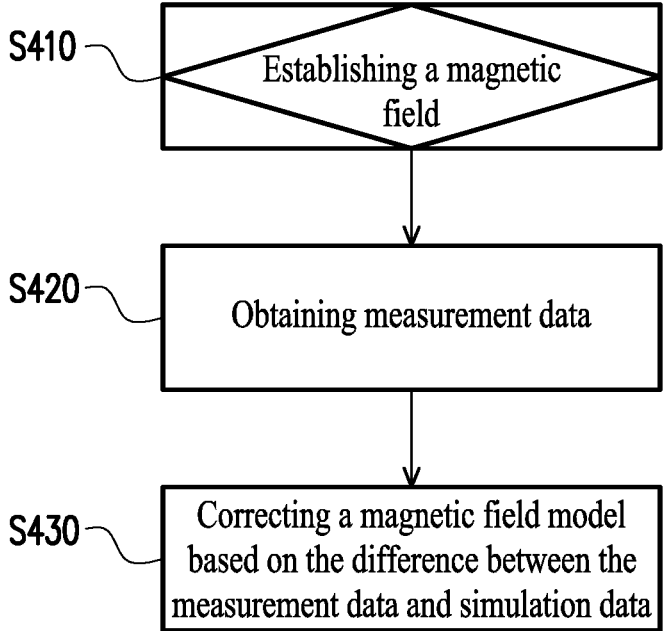
FIG. 4 is a flow chart of a calibration method of the magnetic field model according to an embodiment of the present invention.

FIG. 4 is a flow chart of a calibration method of the magnetic field model according to an embodiment of the present invention. Referring to FIG. 4, the processor 73 establishes a magnetic field through the magnetic field transmitter 10, 10B (step S410). For example, the processor 73 can control the current gain of the magnetic field transmitter 10, 10B, and drive the magnetic field transmitter 10, 10B to emit signals to establish a magnetic field.

On the other hand, the processor 73 obtains measurement data through the magnetic field sensor 50 (step S420). Specifically, the magnetic field sensor 50 measures the induced voltage amplitude. The measurement data includes induced voltage amplitudes at multiple measurement locations in the magnetic field. Taking a sine wave as an example, the amplitude obtained after demodulating the sine wave is the induced voltage amplitude. The measurement location refers to the location where the magnetic field sensor 50 performs measurements and obtains measurement data. Each measurement position combination may include multiple measurement positions located on the same height plane. The height plane refers to a plane that is a certain height away from the magnetic field transmitter 10, 10B, and the height can be adjusted according to actual needs. Multiple height planes correspond to combinations of measurement positions separated by multiple heights.

Figure 5A:
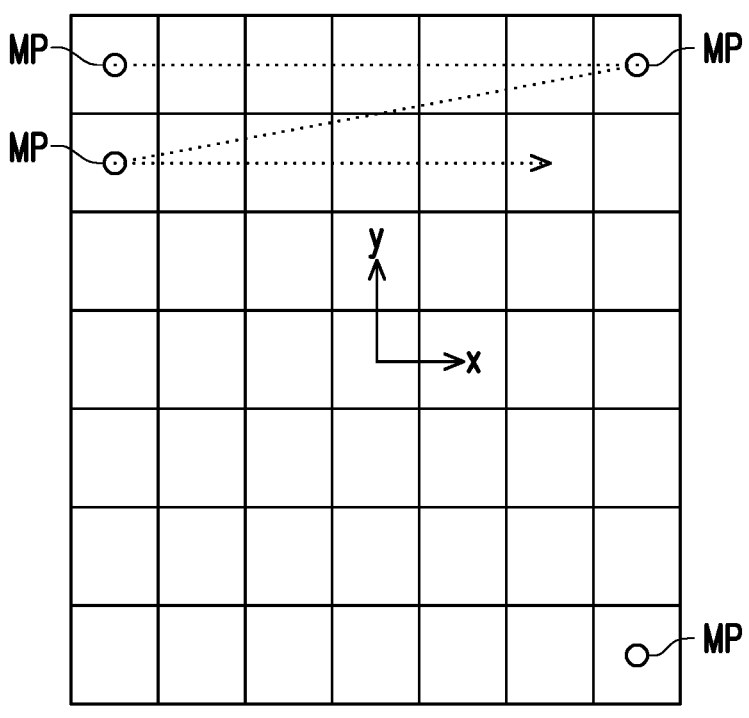
FIG. 5A is a schematic diagram of a calibration plate according to an embodiment of the present invention.

In an embodiment, the measurement positions in a measurement position combination are arranged in a matrix. The horizontal spacing and/or vertical spacing of each adjacent measurement position is the same. For example, FIG. 5A is a schematic diagram of a calibration plate CB according to an embodiment of the present invention. Referring to FIG. 5A, the calibration plate CB is a 7×7 matrix. That is, the calibration plate CB is evenly divided into 49 blocks. The center of each block is defined as the measurement position MP. Therefore, the calibration plate CB defines 49 measurement positions MP. These measurement positions MP are located in the same height plane (for example, the x-y plane shown in the figure).

Figure 5B:
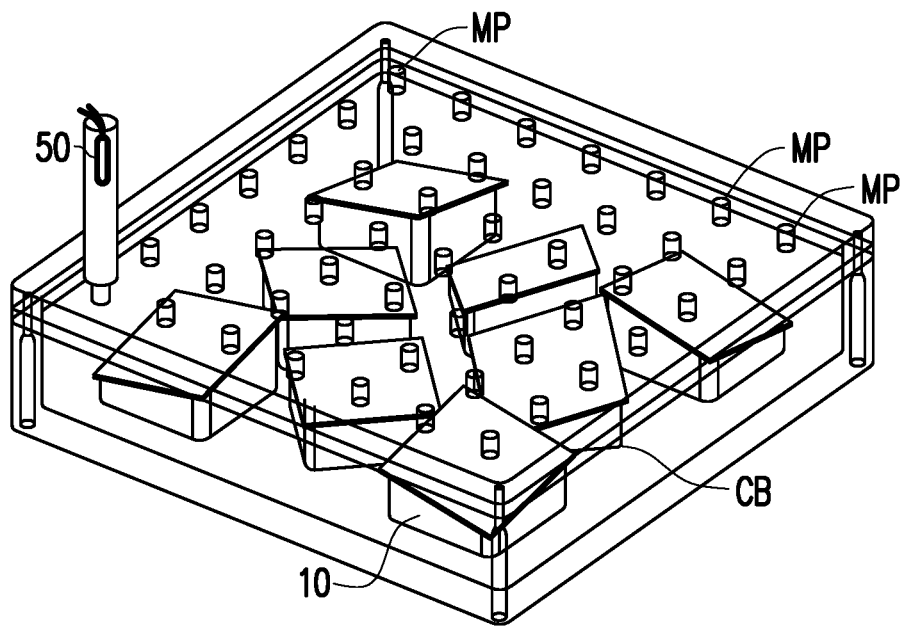
FIG. 5B is a schematic diagram illustrating measurement using a calibration plate according to an embodiment of the present invention.

FIG. 5B is a schematic diagram illustrating measurement using the calibration plate CB according to an embodiment of the present invention. Referring to FIG. 5B, the calibration plate CB is parallel to the plane where the magnetic field transmitter 10 is located, and the calibration plate CB is a certain height (such as, 1, 5 or 10 cm, but is not limited thereto) away from the magnetic field transmitter 10. The magnetic field sensor 50 measures the induced voltage amplitude at each measurement position MP defined by the calibration plate CB, and generates the ground truth induced voltage amplitude matrix (as sensing data) accordingly. Each element of the induced voltage amplitude matrix corresponds to a certain measurement position MP of the calibration plate CB.

It should be noted that, the number and location of measurement locations can still be changed according to actual needs.

Referring to FIG. 4, the processor 73 corrects the magnetic field model based on the error between the measurement data and the simulation data (step S430). Specifically, the magnetic field model ($\Phi_c$) is based on Biot-Savart law and Faraday's law of induction, and the magnetic field model is used to generate simulation data corresponding to multiple measurement positions. The magnetic field model is a corresponding relationship or mathematical model between the magnetic flux and the position and attitude.

Magnetic flux can be used in a spatial positioning algorithm. In an embodiment, the spatial positioning algorithm is, for example, Biot-Savart law. The magnetic field is related to the size, direction and distance of the current. The Biot-Savart law can analyze the magnetic flux density of any current-carrying line segment within the magnetic field transmitter 10 at any point in space, and can be used to illustrate the magnetic field distribution at a plane height. The induced voltage amplitude can be used to calculate the magnetic flux. Therefore, the processor 73 can infer the measurement position of the magnetic field sensor 50 based on the magnetic flux or induced voltage amplitude (i.e., sensing data).

Besides, the Faraday's law of induction defines the relationship between the magnetic flux and the magnetic field. For example, $\Phi_B = \iint_{\Sigma(t)} B(r,t) \cdot dA$, where $\Phi_B$ is magnetic flux, dA is an area element of the moving surface $\Sigma(t)$, B is magnetic field, B·dA is vector dot product. Based on the relationship between the magnetic flux, measurement position and magnetic field, a reference model (herein referred to as the magnetic field model) of the theoretical electromagnetic field can be established. By providing the measurement position to the magnetic field model, the magnetic flux at the measurement position (i.e., the induced voltage amplitude corresponding to the simulation data) can be obtained. However, there is still error between the simulation data and the measurement data. Therefore, the difference between the magnetic field model and the actual magnetic field can be determined by minimizing the error, and the magnetic field model can be modified/corrected/compensated accordingly.

The processor 73 establishes one or more objective functions through a nonlinear least squares method according to the error between the measurement data and the simulation data. In an embodiment, one or more objective functions Fi based on the nonlinear least squares method is:

$$F_i\left(\kappa_i, r_i^{offset}\right) = \tag{1}$$

$$\sum_{j=1}^{m}\left(V0_{meas}^{i}\left(r_j - r_i^{offset}, \theta_j, \varphi_j\right) - \kappa_i V0_{calc}^{i}\left(r_j - r_i^{offset}, \theta_j, \varphi_j\right)\right)^2,$$

$V0_{meas}^{i}(\ )$ is amplitude of the induced voltage of the measurement data, $$r_j = (x_j, \gamma_j, z_j), r_i^{offset} = \left(0, 0, H_i^{offset}\right),$$

$x_j, y_j, z_j$ are coordinates of the magnetic field sensor 50 in a three-dimensional space, $$H_i^{offset}$$

is height compensation parameter (Hoffset), $\kappa_i$ is the i-th scale parameter, $$r_j(x_j, y_j, z_j), r_i^{offset} = \left(0, 0, H_i^{offset}\right),$$

is amplitude of the induced voltage of the simulation data, $\theta_j$ and $\varphi_j$ are attitude angles of the magnetic field sensor in the three-dimensional space (such as, an angle relative to the horizontal reference plane and the vertical reference plane), m is a measurement number of each measurement positions. The number of scale parameters corresponds to the number of transmitting units of the magnetic field transmitter 10. Taking the 8 transmitting units Tx1~Tx8 in FIG. 2 as an example, there can be 8 scale parameters. That is, $\kappa_1 \sim \kappa_8$. However, the number of scale parameters can still be adjusted according to actual needs.

Taking the 49 measurement positions MP shown in FIG. 5A and FIG. 5B as an example, the magnetic field sensor 50 is used to sequentially collect the data of 8*1 induced voltage amplitude (i.e., the value of the magnetic flux) of each measurement position MP, and then output the data of 8*49 induced voltage amplitude matrix V0m. These sensing data can be substituted into $$V0_{meas}^{i}$$

in the objective function Fi.

In some application scenarios, the magnetic field sensor 50 may be moved to multiple measurement positions by hand, so there are artificial movement and mechanical accuracy errors. Theoretically, the z-axis height of multiple measurement positions at the same height is constant. By designing the height compensation parameter to modify the ground truth actual height in the z-axis direction, the actual distance (or height distance) between the magnetic field sensor 50 and the magnetic field transmitter 10 can also be estimated through the calibration program.

The processor 73 determines a modified magnetic field model based on one or more solutions of one or more objective functions. Specifically, one or more solutions of the objective function include the value of the scale parameter and the value of the height compensation parameter. The scale parameter and the height compensation parameter of multiple transmitting units with the minimum error of the objective function can be analyzed through the nonlinear least squares algorithm. For example, determine the solution that minimizes the objective function Fi.

In other embodiments, other error equations may be used to define the objective function corresponding to the error. For example, mean square error (MSE), mean absolute error (MAE) or root mean square error (RMSE).

In an embodiment, the processor 73 may determine the estimated position corresponding to the modified magnetic field model based on one or more solutions. If solutions that minimize the objective function have been determined, these solutions will be used as compensation parameters for the magnetic field model and a modified magnetic field model will be generated accordingly. The magnetic flux corresponding to the induced voltage amplitude in the measurement data is substituted into the modified magnetic field model to estimate the corresponding estimated position. That is, spatial positioning is performed through the modified magnetic field model to estimate the position corresponding to the magnetic flux measured by the magnetic field sensor 50 (i.e., the estimated position).

Figure 6:
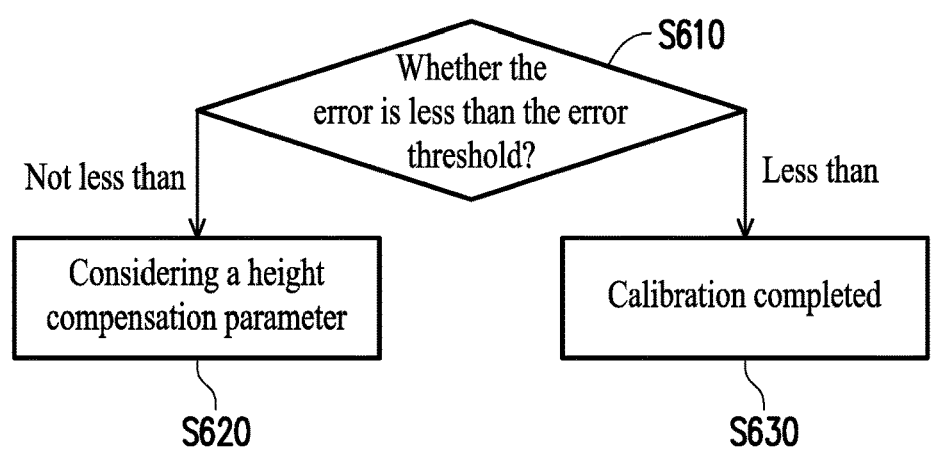
FIG. 6 is a flow chart of quality verification according to an embodiment of the present invention.

The processor 73 can determine whether to further modify the magnetic field model based on the error between the estimated position and the corresponding (real) measurement position. For example, FIG. 6 is a flow chart of quality verification according to an embodiment of the present invention. Referring to FIG. 6, the processor 73 can determine whether the error between the estimated position and the corresponding (real) measurement position is less than an error threshold (step S610). The error between the estimated position and the corresponding (true) measurement position can be defined by MSE, MAE or RMSE. The error threshold is, for example, 1 millimeter (mm), 0.8 mm or 0.5 mm, but is not limited thereto.

In response to the error between the estimated position and the corresponding (real) measurement position being not less than (i.e., greater than or equal to) the error threshold, the height compensation parameter is considered and the magnetic field model is modified again (step S620). For example, the height of the measurement location (such as, the z-axis coordinate) is subtracted by the height compensation parameter. Then, the magnetic flux (i.e., sensing data) is obtained again through the magnetic field sensor 50. On the other hand, when the error between the estimated position and the corresponding (real) measurement position is less than the error threshold, the calibration is completed and the modified magnetic field model (which can be considered as a reference model with high accuracy) is determined (step S630). For example, the current compensation parameter is used as a parameter to modify the magnetic field model. For another example, a modified magnetic field model ($\kappa_i * \Phi_c$) is generated based on the compensation parameter.

In an embodiment, the processor 73 can determine whether to further modify the magnetic field model based on the height compensation parameter. For example, the processor 73 can determine whether the height compensation parameter is less than a parameter threshold. The parameter threshold is, for example, 10-12 mm, 0.5×10−12 mm, or 0.9×10−12 mm, but is not limited thereto. In response to the fact that the height compensation parameter is less than the parameter threshold, the processor 73 can complete the calibration and determine the modified magnetic field model. On the other hand, in response to the fact that the height compensation parameter is not less than the parameter threshold, the processor 73 can modify the magnetic field model again.

In an embodiment, if the actual height (or vertical height) of the magnetic field sensor 50 in the z-axis direction is known, the above model calibration program can omit the solution of the height compensation parameter (Hoffset).

Figure 7:
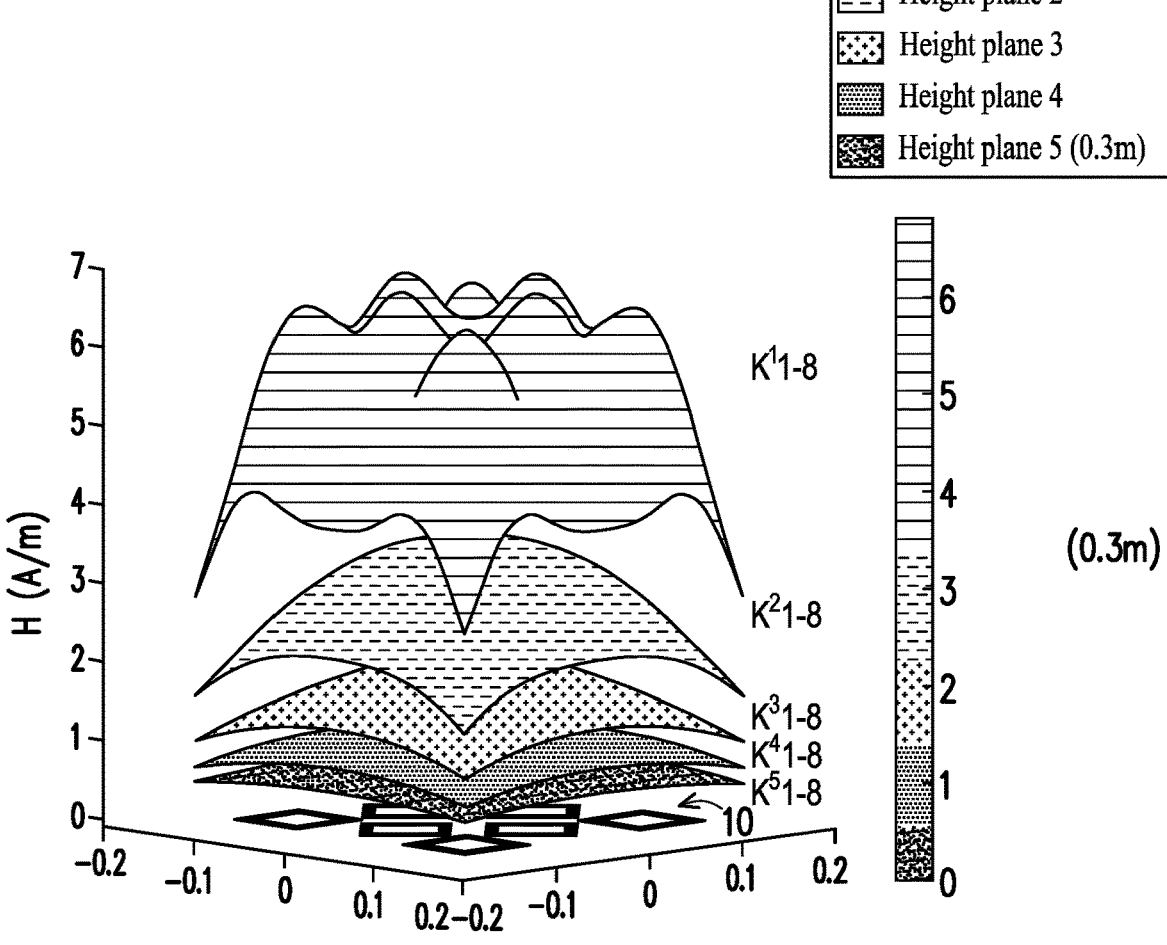
FIG. 7 is a schematic diagram of magnetic field models corresponding to multiple height planes according to an embodiment of the present invention.

FIG. 7 is a schematic diagram of magnetic field models corresponding to multiple height planes according to an embodiment of the present invention. Referring to FIG. 7, based on the variable sensing gain of the magnetic field sensor 50 (for example, the amplification/gain of the original signal of the magnetic field sensor 50 is $$V_{out} = V_{in}\left(1 + \frac{R_f}{R_g}\right),$$

$V_{out}$ is output voltage, $V_{in}$ is input voltage, $R_f$ is the resistance value of the feedback impedance, $R_g$ is the resistance value of the resistor (which can be called the input resistor) in the resistor divider through which the input signal passes, so the amplification factor of the original signal of the magnetic field sensor 50 can be adjusted by designing the resistance value $R_g$), under the condition that the sensing signal-to-noise ratio (SNR) is maximized at each height, multi-layer scaling parameters are established through the calibration program, and magnetic field models corresponding to different heights (planes) are established accordingly. It is also worth noting that the working principle of the above amplification process is that by adjusting the resistance of the feedback resistor, the gain can be controlled. The input signal is amplified at the non-inverting input end, and the output signal is fed back at the inverting input end. The feedback process causes the output signal to have the same phase as the input signal. As shown in the figure, the 5 height planes correspond to 5 sets of the scale parameters. Assume that the nth group of the scale parameters is $k^n1$-8, and n is an integer from 1 to 5. The current (I) of 8 groups of the transmitting units/coils is analyzed to be 0.25 A, and the plane fields are simulated at different heights. The magnetic field amplitude in the plane area close to the surface of the transmitting unit/coil at a distance of 10-50 mm is not uniform, while the magnetic field amplitude at a distance of 110 mm already shows a more uniform field distribution. The experimental results have proven that uniform field distribution can improve positioning accuracy.

It should be noted that, the heights of these height planes relative to the plane where the magnetic field transmitter 10 is located can be adjusted according to actual needs. In some application scenarios, the distance between these height planes is smaller due to the higher sensitivity closer to the magnetic field transmitter 10. For example, the distance between height plane 4 and height plane 5 is smaller than the distance between height plane 3 and height plane 4.

The processor 73 can respectively establish magnetic field models corresponding to multiple height planes based on the errors between the measurement data corresponding to the multiple height planes and the corresponding simulation data. The establishment of each magnetic field model can refer to the foregoing description of the modification of the magnetic field model, which will not be described again here.

Figure 8:
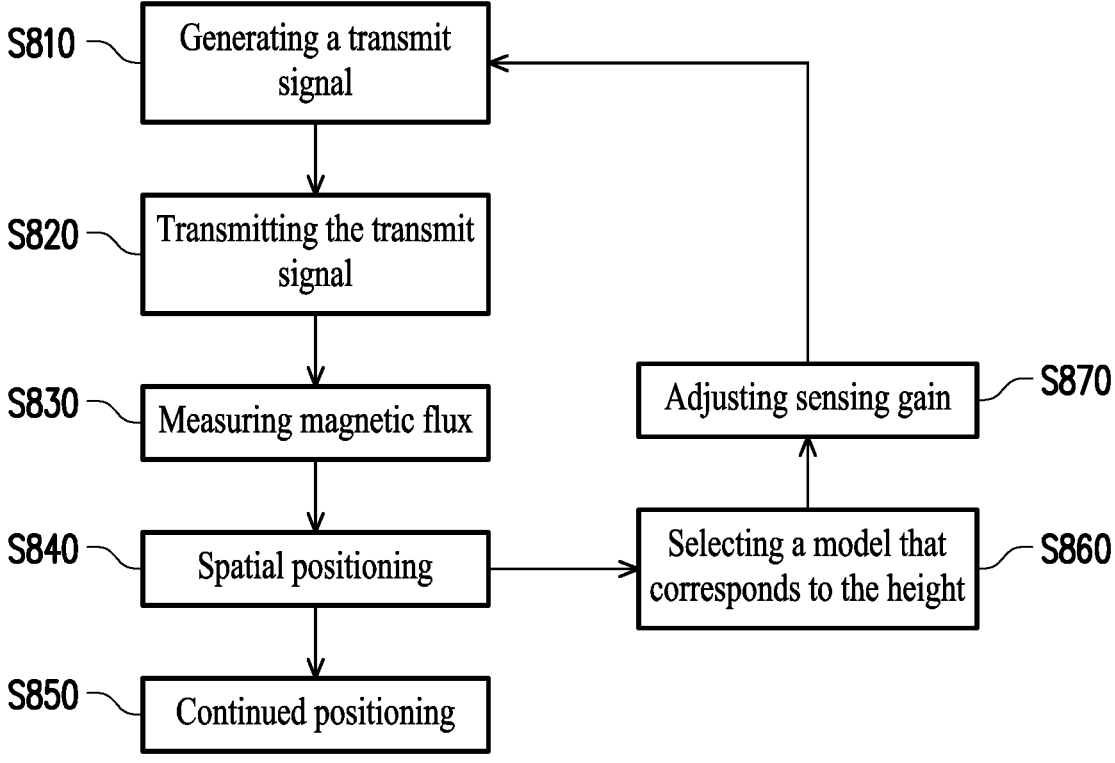
FIG. 8 is a flow chart of a feedback control method according to an embodiment of the present invention.

FIG. 8 is a flow chart of a feedback control method according to an embodiment of the present invention. Referring to FIG. 8, the processor 73 can generate a transmit signal (for example, through signal amplification, filtering processing) through the magnetic field transmitter 10, 10B (step S810), and transmit the transmit signal (for example, through the transmitting coil/unit) (step S820), to establish a magnetic field. On the other hand, the processor 73 can measure the induced voltage amplitude (i.e., obtain measurement data), amplification (magnification) and/or filtering (step S830) through the magnetic field sensor 50. Assuming that the magnetic field transmitter 10, 10B is composed of 8 transmitting coils, the oscilloscope can measure the output voltage $V_{out}$ induced by the magnetic field sensor 50. Then, the voltage amplitude value is obtained through asynchronous demodulation, which is equivalent to the data of 8*1 induced voltage amplitude matrix.

The processor 73 can use the magnetic field model to perform spatial positioning according to the magnetic flux (step S840). For example, the position and attitude of the magnetic field sensor 50 are inferred through the magnetic field model. Thereby, the processor 73 can determine the measurement height (that is, the magnetic field sensor 50 and the vertical distance/height of the magnetic field transmitter 10,10B) of the magnetic field sensor 50 based on the measurement data.

The processor 73 can continuously perform dynamic positioning using the same magnetic field model (step S850). On the other hand, the processor 73 can select the magnetic field model corresponding to the measurement height obtained by spatial positioning (step S860), and use it for subsequent spatial positioning. As shown in FIG. 7, the height plane is selected closest to the measured height and the corresponding (and modified) magnetic field model of the height plane is selected. By instantly switching the magnetic field model that has been established corresponding to the height in advance, the positioning accuracy in the operating space can be improved.

The processor 73 can adjust the sensing gain of the magnetic field sensor 50 according to the selected magnetic field model (step S870). It is worth noting that as the height increases, the magnetic field strength of the magnetic field transmitters 10 and 10B also decreases rapidly with distance, thus causing the signal-to-noise ratio (SNR) of the magnetic field sensor 50 to decrease, thereby affecting the positioning accuracy and limiting the measurement height. Therefore, the embodiment of the present invention provides an adjustable sensing gain, and the sensing gain is changed through the modulating resistor Rg. For example, when the magnetic field sensor 50 is close to the magnetic field transmitter 10, the processor 73 can reduce the sensing gain of the magnetic field sensor 50. For another example, when the magnetic field sensor 50 is far away from the magnetic field transmitter 10, the processor 73 can increase the sensing gain of the magnetic field sensor 50. The sensing gain may be voltage, current or other form of power. Each set of sensing gains of the magnetic field sensor 50 will have a set of magnetic field (numeric) models corresponding to the heights (corresponding to multiple scale parameters); since different heights have different sensing gains (for example, the scaling parameter $k^n1$-8 of the nth height plane), the positioning algorithm has at least one set of magnetic field (numerical) models.

In summary, in the calibration method of magnetic field model and the controller for electromagnetic positioning of the embodiment of the present invention, the objective function is established based on the error between the measurement data and the simulation data estimated by the theoretical magnetic field model, and the magnetic field model with higher positioning accuracy is generated by minimizing the error in the objective function and inverse height. In addition, corresponding magnetic field models are provided for different measurement heights, and the sensing gain is adjusted accordingly. In this way, positioning accuracy can be improved.

Although the present application has been disclosed as above with embodiments, it is not intended to limit the present application. Any person with ordinary knowledge in the art, without departing from the spirit and scope of the present application, can make some changes. Therefore, the protection scope of the present application shall be determined by the scope of the claims.

What is claimed is:

1. A calibration method of magnetic field model for electromagnetic positioning, comprising:

establishing a magnetic field through a magnetic field transmitter;

obtaining measurement data through a magnetic field sensor, wherein the measurement data includes the amplitudes of induced voltage at multiple measurement positions in the magnetic field;

correcting a magnetic field model according to an error between the measurement data and simulation data, wherein the magnetic field model is used to generate the simulation data corresponding to the measurement locations, and the steps of correcting the magnetic field model include:

establishing at least one objective function through a nonlinear least squares method based on the error between the measurement data and the simulation data; and determining the modified magnetic field model based on at least one solution of the at least one objective function, wherein the at least one solution of the at least one objective function comprises a value of a scale parameter and a height compensation parameter, the scale parameter corresponds to amplitudes of induced voltage of the simulation data in the at least one objective function, and the height compensation parameter is used to modify a ground truth actual height in a z-axis direction; and performing spatial positioning through the modified magnetic field model to estimate a position corresponding to magnetic flux measured by the magnetic field sensor.

2. The calibration method of magnetic field model for electromagnetic positioning according to claim 1, wherein the at least one objective function Fi based on the nonlinear least squares method is:

$$F_i\left(\kappa_i, r_i^{offset}\right) =$$

$$\sum_{j=1}^{m} \left(V0_{meas}^i\left(r_j - r_i^{offset}, \theta_j, \varphi_j\right) - \kappa_i V0_{calc}^i\left(r_j - r_i^{offset}, \theta_j, \varphi_j\right)\right)^2,$$

$V0(\ )$ is amplitude of the induced voltage of the measurement data, $$r_j = (x_j, y_j, z_j), r_i^{offset} = \left(0, 0, H_i^{offset}\right),$$

$x_j, y_j, z_j$ are coordinates of the magnetic field sensor in a three-dimensional space, $$H_i^{offset}$$

is the height compensation parameter, $\kappa_i$ is the i-th scale parameter, $$V0_{calc}^i(\ )$$

is one of the amplitudes of the induced voltage of the simulation data, $\theta_j$ and $\varphi_j$ are attitude angles of the magnetic field sensor in the three-dimensional space, m is a measurement number of each measurement positions.

3. The calibration method of magnetic field model for electromagnetic positioning according to claim 1, wherein the step of determining the modified magnetic field model based on the at least one solution of the at least one objective function comprises:

determining an estimated position corresponding to the modified magnetic field model based on the at least one solution; and determining whether to further modify the magnetic field model based on an error between the estimated position and the corresponding measurement position.

4. The calibration method of magnetic field model for electromagnetic positioning according to claim 1, wherein the step of determining the modified magnetic field model based on the at least one solution of the at least one objective function comprises:

determining whether to modify the magnetic field model again based on the height compensation parameter.

5. The calibration method of magnetic field model for electromagnetic positioning according to claim 1, further comprises:

determining a measurement height based on the measurement data;

selecting the magnetic field model corresponding to the measurement height; and adjusting sensing gain of the magnetic field sensor according to the selected magnetic field model.

6. A controller, comprising:

a memory, configured to store a program code;

a processor, coupled to the memory and loads the program code to execute:

establishing a magnetic field through a magnetic field transmitter;

obtaining measurement data through a magnetic field sensor, wherein the measurement data includes the amplitudes of induced voltage at multiple measurement positions in the magnetic field; and correcting a magnetic field model according to an error between the measurement data and simulation data, wherein the magnetic field model is used to generate the simulation data corresponding to the measurement locations, and the processor is further configured to:

establishing at least one objective function through a nonlinear least squares method based on the error between the measurement data and the simulation data; and determining the modified magnetic field model based on at least one solution of the at least one objective function, wherein the at least one solution of the at least one objective function comprises a value of a scale parameter and a height compensation parameter, the scale parameter corresponds to amplitudes of induced voltage of the simulation data in the at least one objective function, and the height compensation parameter is used to modify a ground truth actual height in a z-axis direction; and performing spatial positioning through the modified magnetic field model to estimate a position corresponding to magnetic flux measured by the magnetic field sensor.

7. The controller according to claim 6, wherein the at least one objective function Fi based on the nonlinear least squares method is:

$$F_i\left(\kappa_i, r_i^{offset}\right) =$$
$$\sum_{j=1}^{m}\left(V0_{meas}^i\left(r_j - r_i^{offset}, \theta_j, \varphi_j\right) - \kappa_i V0_{calc}^i\left(r_j - r_i^{offset}, \theta_j, \varphi_j\right)\right)^2,$$

V0( ) is amplitude of the induced voltage of the measurement data, $$r_j = (x_j, y_j, z_j), r_i^{offset} = \left(0, 0, H_i^{offset}\right),$$

$x_j, y_j, z_j$ are coordinates of the magnetic field sensor in a three-dimensional space, $$H_i^{offset}$$

is the height compensation parameter, $\kappa_i$ is the i-th scale parameter, $$V0_{calc}^i(\,)$$

is one of the amplitudes of the induced voltage of the simulation data, $\theta_j$ and $\varphi_j$ are attitude angles of the magnetic field sensor in the three-dimensional space, m is a measurement number of each measurement positions.

8. The controller according to claim 6, wherein the processor is further configured to:

determining an estimated position corresponding to the modified magnetic field model based on the at least one solution; and determining whether to further modify the magnetic field model based on an error between the estimated position and the corresponding measurement position.

9. The controller according to claim 6, wherein the processor is further configured to:

determining whether to modify the magnetic field model again based on the height compensation parameter.

10. The controller according to claim 6, wherein the processor is further configured to:

determining a measurement height based on the measurement data;

selecting the magnetic field model corresponding to the measurement height; and adjusting sensing gain of the magnetic field sensor according to the selected magnetic field model.

* * * * *